United States Patent
Bedell et al.

(10) Patent No.: US 8,440,547 B2
(45) Date of Patent: May 14, 2013

(54) METHOD AND STRUCTURE FOR PMOS DEVICES WITH HIGH K METAL GATE INTEGRATION AND SIGE CHANNEL ENGINEERING

(75) Inventors: Stephen W. Bedell, Wappingers Falls, NY (US); Ashima B. Chakravarti, Hopewell Junction, NY (US); Michael P. Chudzik, Danbury, CT (US); Judson R. Holt, Wappingers Falls, NY (US); Dominic J. Schepis, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 12/367,759

(22) Filed: Feb. 9, 2009

(65) Prior Publication Data
US 2010/0200937 A1    Aug. 12, 2010

(51) Int. Cl.
*H01L 21/20* (2006.01)
*H01L 21/36* (2006.01)

(52) U.S. Cl.
USPC ............ 438/478; 257/190; 257/611; 438/549

(58) Field of Classification Search .................. 257/190, 257/197, 407, 758, 611; 438/151, 166, 197, 438/479, 770, 478, 549
See application file for complete search history.

(56) References Cited

U.S. PATENT DOCUMENTS

| | | | |
|---|---|---|---|
| 6,620,664 B2 | 9/2003 | Ma et al. | |
| 6,734,527 B1 | 5/2004 | Xiang | |
| 6,759,695 B2 | 7/2004 | Ma et al. | |
| 7,033,893 B1 | 4/2006 | Xiang | |
| 7,094,671 B2 | 8/2006 | Li | |
| 7,187,059 B2 | 3/2007 | Chan et al. | |
| 7,229,893 B2 | 6/2007 | Wang et al. | |
| 7,235,822 B2 | 6/2007 | Li | |
| 7,279,756 B2 | 10/2007 | Wang et al. | |
| 7,332,407 B2 | 2/2008 | Wang et al. | |
| 7,355,235 B2 | 4/2008 | Wang et al. | |
| 7,368,356 B2 | 5/2008 | Li | |
| 7,417,248 B2 | 8/2008 | Li | |
| 2003/0146428 A1 | 8/2003 | Ma et al. | |
| 2004/0077136 A1 | 4/2004 | Ma et al. | |
| 2005/0070053 A1* | 3/2005 | Sadaka et al. .................. 438/151 |
| 2005/0215071 A1* | 9/2005 | Moriceau et al. .............. 438/770 |
| 2005/0285159 A1 | 12/2005 | Chan et al. | |
| 2005/0287759 A1 | 12/2005 | Wang et al. | |
| 2006/0017112 A1 | 1/2006 | Wang et al. | |
| 2006/0042542 A1* | 3/2006 | Bedell et al. ................... 117/105 |

(Continued)

OTHER PUBLICATIONS

Office Action dated Dec. 26, 2012 received in a related U.S. Patent Application, namely U.S. Appl. No. 13/431,328.

*Primary Examiner* — Kimberly Rizkallah
*Assistant Examiner* — Errol Fernandes
(74) *Attorney, Agent, or Firm* — Scully, Scott, Murphy & Presser, P.C.; Joseph P. Abate, Esq.

(57) ABSTRACT

Various techniques for changing the workfunction of the substrate by using a SiGe channel which, in turn, changes the bandgap favorably for a p-type metal oxide semiconductor field effect transistors (pMOSFETs) are disclosed. In the various techniques, a SiGe film that includes a low doped SiGe region above a more highly doped SiGe region to allow the appropriate threshold voltage (Vt) for pMOSFET devices while preventing pitting, roughness and thinning of the SiGe film during subsequent cleans and processing is provided.

13 Claims, 3 Drawing Sheets

U.S. PATENT DOCUMENTS

| | | |
|---|---|---|
| 2006/0105533 A1 | 5/2006 | Chong et al. |
| 2006/0292762 A1 | 12/2006 | Borland et al. |
| 2007/0069302 A1 | 3/2007 | Jin et al. |
| 2007/0090416 A1 | 4/2007 | Doyle et al. |
| 2007/0111419 A1 | 5/2007 | Doyle et al. |
| 2007/0187725 A1 | 8/2007 | Wang et al. |
| 2007/0262451 A1* | 11/2007 | Rachmady et al. .......... 257/758 |
| 2008/0048210 A1 | 2/2008 | Shima |
| 2009/0261424 A1* | 10/2009 | Chang et al. ................ 257/392 |

* cited by examiner

METHOD AND STRUCTURE FOR PMOS DEVICES WITH HIGH K METAL GATE INTEGRATION AND SIGE CHANNEL ENGINEERING

FIELD OF THE INVENTION

The present invention relates to a semiconductor structure and a method of fabricating the same. More particularly, the present invention relates to a semiconductor structure for a p-type metal oxide semiconductor (MOS) including a high k gate dielectric and an engineered SiGe channel and methods of fabricating the same.

BACKGROUND OF THE INVENTION

In the quest for improved semiconductor device performance, semiconductor circuits are becoming denser and the semiconductor devices located therein are becoming smaller. For example, the most common dielectric in MOS field effect transistors has been $SiO_2$. However as the thickness of $SiO_2$ approaches 15 angstroms, substantial problems appear, including, for example, leakage currents through the gate dielectric, concerns about the long-term dielectric reliability, and the difficulty in manufacturing and thickness control.

One solution to the above problem is to use thick (greater than 20 angstroms) films of materials, such as hafnium oxide ($HfO_2$), that have a dielectric constant that is larger than $SiO_2$, e.g., high k gate dielectrics. Thus, the physical thickness of the high k gate dielectric can be large, while the electrical equivalent thickness relative to $SiO_2$ films can be scaled.

Introduction of high k gate dielectrics, such as $HfO_2$, $ZrO_2$ or $Al_2O_3$, in gate stacks has proven to reduce leakage current by several orders of magnitude. Such leakage current reduction has enabled the fabrication of complementary metal oxide semiconductor (CMOS) devices with lower power consumption.

It is also desirable to replace Si-containing gates with metal gates that give a workfunction near the band edge for both nMOS and pMOS devices. A number of metal gates are known for nMOS devices; however, metal gates for pMOS devices are rarer.

As such, there is an ongoing need for providing pMOS devices that include a high k gate dielectric in which the workfunction thereof is near the band edge for pMOS devices which does not necessarily have to rely solely on a p-type workfunction metal.

SUMMARY OF THE INVENTION

The invention provides a solution to the above problem by changing the workfunction of the substrate to SiGe rather than Si which changes the bandgap favorably for subsequent fabrication of pMOS devices. Although such a solution has been proposed in the past, the actual building of such devices has been rare and extremely difficult. Moreover, in order to get a strong threshold voltage shift (Vt) for current metals a reasonable high Ge content (greater than 30 atomic %) was previously used. High Ge content SiGe films suffer from defect formation as well as erosion, pitting and rough surfaces, all of which degrade the pMOS mobility.

The present invention provides various means for changing the workfunction of the substrate by using a SiGe channel which, in turn, changes the bandgap favorably for a p-type metal oxide semiconductor field effect transistor (pMOSFET). The invention includes providing a SiGe film that includes a low doped SiGe region above a more highly doped SiGe region to allow the appropriate threshold voltage (Vt) for pMOSFET devices while preventing pitting, roughness and thinning of the SiGe film during subsequent cleans and processing.

In general terms, a method of fabricating a substrate including an engineered SiGe channel that is suitable for pMOSFET devices is provided which includes:
providing a semiconductor substrate having at least one active area with an exposed upper surface; and
forming a SiGe film on the exposed upper surface of the active area, said SiGe film including a lower region that has a first Ge concentration and an upper region that has a second Ge concentration, wherein the first Ge concentration is greater than the second Ge concentration.

In one embodiment, the forming of the SiGe film includes the formation of an oxide cap on the surface of an initial SiGe layer. During the formation of the oxide cap, the Ge content within the SiGe layer diffuses downward away from the interface of the growing oxide cap. After the oxide cap is stripped, a silicon (Si) cap is formed on the remaining SiGe layer. In this embodiment, the combination of the Si cap and the oxidized and stripped SiGe layer represents the SiGe film mentioned above. That is, the Si cap represents an upper region of the SiGe film that has less Ge than the lower region which is represented by the oxidized and stripped SiGe layer.

In another embodiment, the forming of the SiGe film includes forming a Si cap on an initial SiGe layer and thereafter subjecting the structure to a heating process that causes the formation of the SiGe film.

In yet another embodiment, the SiGe film is formed by forming a SiGe cap having a low Ge content on a surface of an initial SiGe layer that has a high Ge content.

In an even further embodiment, the SiGe film is formed by providing an in-situ doped cap in an upper surface of an initial SiGe layer.

In a still further embodiment, the SiGe film is formed by providing a graded SiGe film whose Ge content decreases upwardly from an interface with the underlying substrate.

The present invention also provides a structure including an engineered SiGe channel that includes:
a semiconductor substrate having at least one active area with an exposed upper surface; and
a SiGe film located on the exposed upper surface of the active area, the SiGe film including a lower region that has a first Ge concentration and an upper region that has a second Ge concentration, wherein the first Ge concentration is greater than the second Ge concentration.

In some embodiments of the invention, the aforementioned structure further includes a high k gate dielectric and a gate conductor located atop the SiGe film. In a highly preferred embodiment, the high k gate dielectric and the gate conductor are elements of a pMOS.

DETAILED DESCRIPTION OF THE INVENTION

The present invention, which provides a structure for a p-type metal oxide semiconductor (MOS) device including a high k gate dielectric and an engineered SiGe channel and methods of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present invention provides several embodiments to provide means for changing the workfunction of the substrate by using a SiGe channel which, in turn, changes the bandgap favorably for a p-type metal oxide semiconductor (pMOS) transistor. The invention includes providing a SiGe film that includes a low doped upper SiGe region directly abutting a more highly doped lower SiGe region to allow the appropriate threshold voltage (Vt) for pMOS devices while preventing pitting, roughness and thinning of the SiGe film during subsequent cleans and processing. The low doped region which is located atop a highly doped region provides protection for the underlying highly doped SiGe region. The highly doped SiGe region provides strain and higher mobility to the inventive structure.

Specifically, and in some embodiments of the invention, a cap is utilized over an initially formed SiGe layer which allows for facile processing of the wafer to provide a substrate having a SiGe film that includes a low doped SiGe region above a more highly doped SiGe region. The substrate can be cleaned and processed to include a pMOS device without pitting and thinning of the SiGe film. In other embodiments, a graded SiGe film is provided that includes a lower region having a high content of Ge and an upper region that has a low content of Ge.

Reference is now made to FIGS. 1A-1E which are pictorial representations (through cross sectional views) depicting the basic processing steps in a first embodiment of the invention. In the first embodiment, an initial SiGe layer is formed atop an active area of a semiconductor substrate and then a surface of the SiGe layer is heated in an oxidizing ambient which causes a surface oxide layer to form as well as causing the Ge atoms within the SiGe layer to diffuse downward towards the substrate. The surface oxide layer is then stripped and thereafter a Si cap is formed on the oxidized and stripped SiGe layer. The combination of the Si cap and the oxidized and stripped SiGe layer forms a SiGe film that includes a lower region (e.g., the oxidized and stripped SiGe layer) that has a first Ge concentration and an upper region (e.g., the Si cap) that has a second Ge concentration, wherein the first Ge concentration is greater than the second Ge concentration.

Figure 1A:
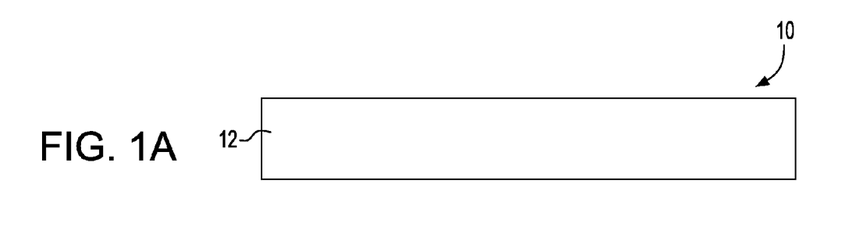
FIGS. 1A-1E are pictorial representations (through cross sectional views) depicting the basic processing steps in accordance with a first embodiment of the invention.

Specifically, FIG. 1A illustrates an initial structure 10 that can be employed in the present invention. The initial structure 10 includes a semiconductor substrate 12. The semiconductor substrate 12 may comprise any semiconductor material including, but not limited to Si, SiGe, SiGeC, SiC, Ge, Ge alloys, GaAs, InAs, InP and other III/V or II/VI compound semiconductors. In addition to these listed types of semiconducting materials, the present invention also contemplates cases in which the semiconductor substrate 12 is a layered semiconductor such as, for example, Si/SiGe, Si/SiC, silicon-on-insulators (SOIs) or silicon germanium-on-insulators (SGOIs). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

It is also noted that the semiconductor substrate 12 may be strained, unstrained or contain strained regions and unstrained regions therein. The semiconductor substrate 12 may also have a single crystal orientation or alternatively, the substrate 12 may be a hybrid semiconductor substrate that has surface regions having different crystallographic orientations. The semiconductor substrate 12 may have any crystallographic (i.e., crystal) orientation. In a preferred embodiment, the semiconductor substrate 12 is a Si-containing material having a (111), (100) or (110) crystal orientation. In one embodiment, the semiconductor substrate 12 is a Si-containing semiconductor material, preferably silicon, having a (100) crystal orientation.

The semiconductor substrate 12 shown in FIG. 1A is formed utilizing any conventional technique that is well known to those skilled in the art. So as not to obscure the invention, the details concerning the fabrication of semiconductor substrate 12 is not provided herein.

Figure 1B:
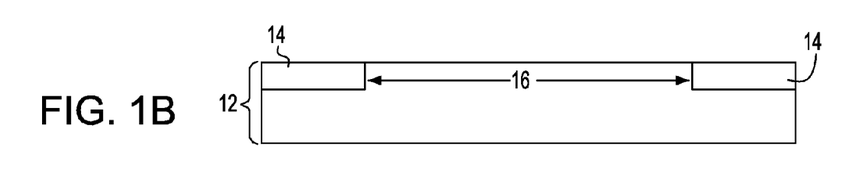

Next, and as illustrated in FIG. 1B, isolation regions 14 are formed into the semiconductor substrate 12. The isolation regions 14 may include trench isolation regions (as specifically shown) or local oxidation of silicon (LOCOS) isolation regions. The area of the semiconductor substrate 12 that is between neighboring isolation regions 14 is referred to herein as the active area 16 of the semiconductor substrate 12. The active area 16 is the region of the substrate in which semiconductor devices, including pFET devices, can be formed.

The isolation regions 14 can be formed utilizing conventional processing well known to those skilled in the art. For example, and when a trench isolation region is formed, the trench isolation regions are formed by first forming at least one trench into the semiconductor substrate 12 by lithography and etching. The at least one trench is then filled with a trench dielectric material such as, for example, a trench oxide. After filling the trench with a trench dielectric material, a planarization process including for example, chemical mechanical polishing (CMP) and/or grinding is typically employed. In some embodiments, the at least one trench is lined with a diffusion barrier material prior to filling the trench with the trench dielectric material. Also, a densification process may follow the trench fill.

When LOCOS isolation regions are formed, the substrate is subjected to a localized oxidation process that is performed under conditions (heat and in an oxidizing ambient) that are capable of forming a localized oxide region in regions of the substrate that are exposed to such a treatment.

After providing the structure shown in FIG. 1B, an initial SiGe layer 18 having a uniform thickness is formed atop the active area 16 of the semiconductor substrate 12 utilizing a conventional epitaxial growth process. Since an epitaxial growth process is used to deposit the SiGe layer 18, the SiGe layer 18 is single crystal and has the same crystal orientation as that of the substrate. The resultant structure including the SiGe layer 18 located on an exposed surface of substrate 12 is shown, for example, in FIG. 1C. The SiGe layer 18 formed in this embodiment of the invention typically, but not necessarily always, has a thickness from 100 angstroms to 200 angstroms, with a thickness from 100 angstroms to 150 angstroms being even more typical. The SiGe layer 18 formed in this embodiment also has a Ge concentration that is about 30 atomic percent or less, with a Ge concentration from 20 atomic percent to 28 atomic percent being even more preferred. The Ge "atomic percent" is used herein to denote the percent of atoms that are Ge vs. Si within the SiGe film.

Figure 1C:
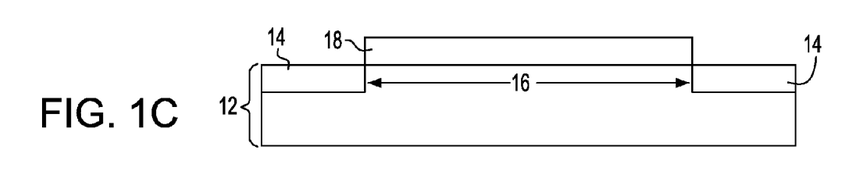
Figure 1D:
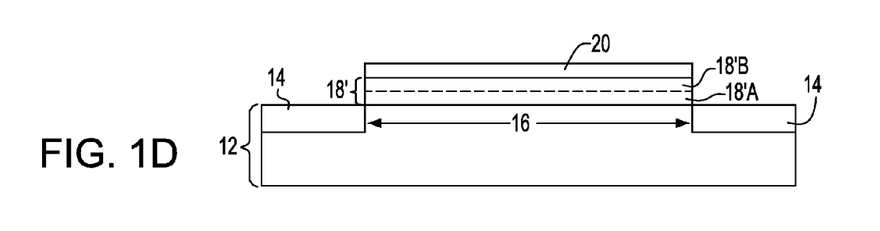

After forming the SiGe layer 18, the structure shown in FIG. 1C is then heated under conditions that are sufficient in forming a surface oxide layer (i.e., oxide cap) 20 atop the SiGe layer 18 as well as causing the diffusion of Ge atoms in a downward direction in the SiGe layer 18. The downward diffusion causes a piling up of Ge atoms in an upper region of the SiGe layer. That is, the heating step forms an oxidized SiGe layer 18' that has a lower region 18'A and an upper region 18'B. The resultant structure after annealing is shown in FIG. 1D.

Typically, the Ge concentration in the lower region 18'A of the oxidized SiGe layer 18' is greater than about 25 atomic percent, while the Ge concentration in the upper region 18'B of the oxidized SiGe layer 18' is about 35 Ge atomic percent or greater. More typically, the Ge concentration in the lower region 18'A of the oxidized SiGe layer 18' is about 35 atomic percent or greater, while the Ge concentration in the upper region 18'B of the oxidized SiGe layer 18' is about 35 atomic percent or greater.

The heating step that is employed in this embodiment of the invention is an annealing step that is performed at a temperature from 800° C. to 1000° C., with a temperature from 900° C. to 950° C. being more preferred. Moreover, the heating step of the first embodiment of the invention is performed in an oxidizing ambient which includes at least one oxygen-containing gas such as, for example, $O_2$, NO, $N_2O$, ozone and air. In some embodiments, the oxygen-containing ambient may be admixed with each other (e.g., an admixture of $O_2$ and NO). Alternatively, the at least one oxygen-containing gas may be admixed with an inert gas including one of argon, helium, xenon, neon, krypton and nitrogen. Preferably, the heating step is performed in an oxidizing ambient that includes $O_2$.

The heating step may be performed for a variable period of time that typically ranges from 10 minutes to 300 minutes, with a time period from 60 minutes to 120 minutes being more typical. The heating step may be performed at a single targeted temperature, or various ramp and soak cycles using various ramp rates and soak times may be employed.

The thickness of the surface oxide layer (i.e., oxide cap) 20 that is formed may vary depending on the conditions of the heating step that is employed. Typically, the surface oxide layer (i.e., oxide cap) 20 has a thickness from 50 angstroms to 750 angstroms, with a thickness from 200 angstroms to 500 angstroms being even more typical. The thickness of the upper region 18'B and the lower region 18'A of the oxidized SiGe layer 18' may also vary depending on the conditions of the heating step employed. Typically, the upper region 18'B has a thickness from 10 angstroms to 100 angstroms, while the lower region 18'A has a thickness from 50 angstroms to 100 angstroms.

Figure 1E:
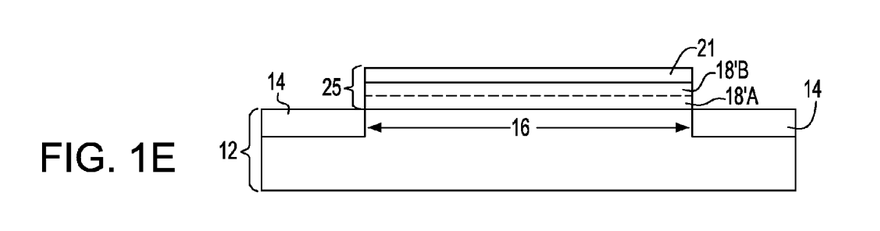

FIG. 1E illustrates the structure of FIG. 1D after stripping the surface oxide layer (e.g., oxide cap) 20 utilizing a conventional stripping process that is well known to those skilled in the art. Examples of stripping processes that can be employed to remove the surface oxide layer 20 include a wet etch using buffered hydrofluoric acid (HF) or dilute HF. A silicon cap 21 can now be grown on the oxidized and stripped SiGe layer 18' to further protect the upper region 18'B of the SiGe film. The silicon cap 21 may be amorphous, polycrystalline, or single crystalline. The details of forming the silicon cap 21 are the same as that for forming silicon cap 22 of the second embodiment of the invention. These details are provided below. The combination of the Si cap 21 and the oxidized and stripped SiGe layer 18' forms a SiGe film 25 that includes a lower region (e.g., the oxidized and stripped SiGe layer including regions 18A' and 18B') that has a first Ge concentration and an upper region (e.g., the Si cap) that has a second Ge concentration, wherein the first Ge concentration is greater than the second Ge concentration.

It is noted that after providing the structure shown in FIG. 1D or 1E conventional complementary metal oxide semiconductor processing steps including high k gate dielectric formation can be used to form a MOS, preferably an pMOS, atop the SiGe film 25. It is noted that the SiGe film 25 is used as an engineered channel of each MOS formed. The formation of the MOS will be described in greater detail herein below.

Figure 2A:
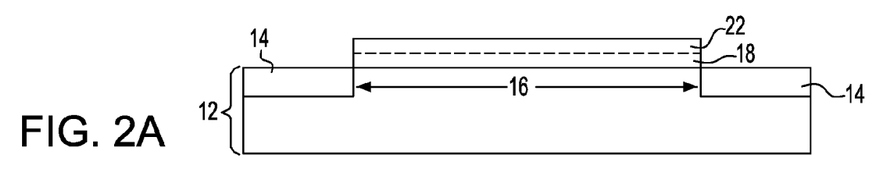
FIGS. 2A-2B are pictorial representations (through cross sectional views) depicting the basic processing steps in accordance with a second embodiment of the invention.
Figure 2B:
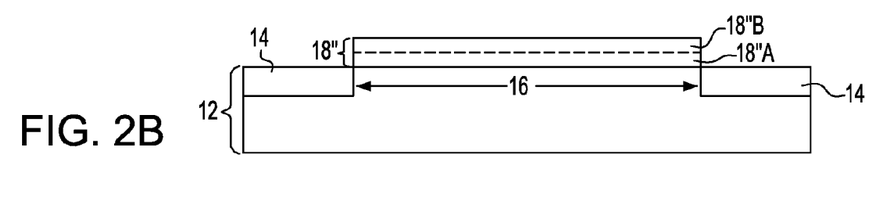

Reference is now made to FIGS. 2A-2B which illustrates a second embodiment of this invention. The second embodiment begins by first providing the structure shown in FIG. 1C. Next, and as shown in FIG. 2A, a silicon cap 22 is formed atop the initial SiGe layer 18. The silicon cap 22 is formed utilizing a conventional deposition process including for example, epitaxial Si growth, chemical vapor deposition (CVD), plasma enhanced chemical vapor deposition (PECVD), atomic layer deposition (ALD), and chemical solution deposition. The Si cap 22 that is formed in this embodiment of the invention has a sufficient thickness to act to passivate the SiGe layer 18. Typically, the Si cap 22 has a thickness from 5 angstroms to 100 angstroms, with a thickness from 10 angstroms to 50 angstroms being even more typical.

FIG. 2B illustrates the structure of FIG. 2A after performing a heating process and after removing the Si cap 22 from the structure. The heating process employed may be from either a thermal cycle used during the formation of the MOS, or from an additional anneal step that is performed prior to MOS fabrication. During the heating process some Ge may diffuse upward into the Si cap, and thereafter intermixing of Ge in the Si cap occurs. This intermixing typically occurs at or near the SiGe/Si cap interface. This diffusion and intermixing forms a SiGe film 18″ which is topped with a reduced thickness Si cap.

Notwithstanding when the heating process is performed, the heating that causes diffusion and intermixing is conducted at a temperature from about 800° C. or greater, with a temperature from about 850° C. to 950° C. being even more typical. In this embodiment, the heating process is typically performed in an inert ambient including, for example, He and/or Ar. Nitrogen can also be used.

In FIG. 2B, reference numeral 18″ denotes the SiGe film that is formed by Ge diffusion and intermixing in this embodiment. The SiGe film 18″ of the second embodiment of the invention has a thickness that is less than the thickness of the originally deposited SiGe film 18. Typically, the SiGe film 18″ has a thickness from 10 angstroms to 100 angstroms, with a thickness from 20 angstroms to 50 angstroms being even more typical. Moreover, the SiGe film 18″ also has a lower region (labeled as 18″A) and an upper region (labeled as 18″B) having the above mentioned characteristics, including Ge content, as the SiGe film 25 of the first embodiment of the invention.

The reduced thickness Si cap is removed utilizing a conventional stripping process that is well known to those skilled in the art. For example, the reduced thickness Si cap can be stripped from the structure by oxidation or a controlled silicon wet or dry etch.

Figure 3A:
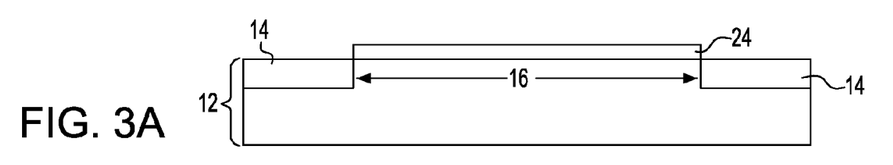
FIGS. 3A-3B are pictorial representations (through cross sectional views) illustrating the basic processing steps in accordance with a third embodiment of the invention.
Figure 3B:
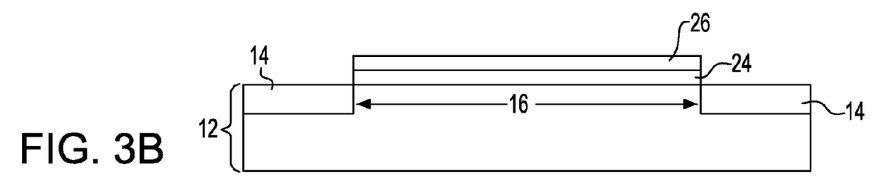

Reference is now made to FIGS. 3A-3B which illustrate processing steps in accordance with a third embodiment of the invention. The third embodiment of the invention begins by providing the structure shown in FIG. 1B. After providing that structure, an initial SiGe layer 24 that has a high Ge content is formed utilizing a conventional epitaxial growth process well known to those skilled in the art. The resultant structure including the SiGe layer 24 is shown, for example, in FIG. 3A.

The Ge content (i.e., concentration) of the thus grown SiGe layer 24 is greater than that used in the first and second embodiments of the invention. Particularly, the Ge content within the thus formed SiGe layer 24 is greater than 25 atomic percent, with a Ge content from 30 atomic percent to 35 atomic percent being even more typical.

The SiGe layer 24 of the third embodiment of the invention has a thickness from 20 angstroms to 100 angstroms, with a thickness from 50 angstroms to 80 angstroms being even more typical.

Next, and as shown in FIG. 3B, a SiGe cap 26 that has a lower Ge content than the SiGe layer 24 is formed utilizing conventional techniques well known to those skilled in the art including, for example, epitaxial growth, CVD, PECVD, ALD and chemical solution deposition. The Ge content of the SiGe cap 26 is about 25 atomic percent or less with a Ge content from 20 atomic percent to 25 atomic percent being even more typical. The SiGe cap 26 of the third embodiment of the invention has a thickness from 5 angstroms to 100 angstroms, with a thickness from 10 angstroms to 50 angstroms being even more typical.

In this embodiment of the invention, the SiGe layer 24 and the SiGe cap 26 form a SiGe film 18‴ having a lower region having a higher Ge content than the upper region.

Figure 4:
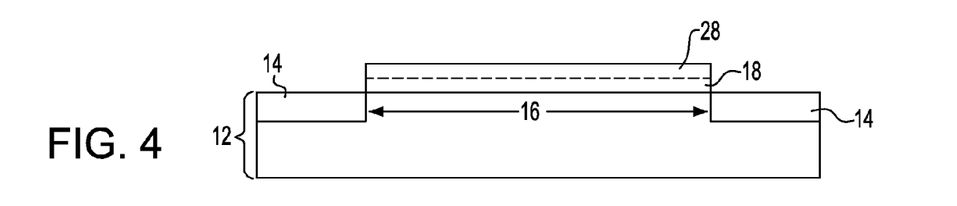
FIG. 4 is a pictorial representation (through a cross sectional view) illustrating a structure that is formed and used during one processing step of a fourth embodiment of the invention.

Reference is now made to FIG. 4 which illustrates a processing step and structure that is used in a fourth embodiment of the invention. The fourth embodiment of the invention begins by providing the structure shown in FIG. 1C. After providing that structure, an upper portion of the SiGe layer 18 is doped with a dopant species from Group IIIA (CAS version) of the Periodic Table of Elements. That is a dopant species selected from B, Al and/or Ga is introduced into the upper surface of the SiGe layer 18 providing the structure shown in FIG. 4. In FIG. 4, reference numeral 28 denotes the upper surface, e.g. doped cap, which contains a Group IIIA dopant species. Of the various IIIA dopant species, it is preferred to use boron.

The doping of SiGe layer 18 may be formed in-situ, i.e., during the formation of the SiGe layer itself, by introducing the IIIA dopant species at the end of the epitaxial growth process. In some embodiments, the doping may occur ex-situ, i.e., after the epitaxial growth of the SiGe layer 18 by means of a conventional doping process including, for example ion implantation, gas phase doping or diffusion doping. Preferably, the doping is performed in-situ. The presence of the Group IIIA dopant species lowers the Ge content within the upper surface of the SiGe layer 18.

The amount of IIIA dopant species introduced into the upper surface of the SiGe layer 18 may vary depending on the type of dopant species and doping process used. Typically, and when boron (B) is used, the upper surface of the SiGe layer includes a boron content from $1\times10^{17}$ B atoms/cm$^3$ to $1\times10^{20}$ B atoms/cm$^3$, with a B content from $5\times10^{17}$ B atoms/cm$^3$ to $5\times10^{13}$ B atoms/cm$^3$ being even more typical. The presence of the dopant species reduces the content of Ge present in the upper region of the SiGe layer 18 and serves as a means to adjust the threshold voltage of the device to be subsequently fabricated thereon.

It is observed that the SiGe layer including the dopant cap 28 represents a SiGe film of the invention including a lower region (undoped SiGe layer) having a higher Ge content than the upper region (doped region).

Figure 5:
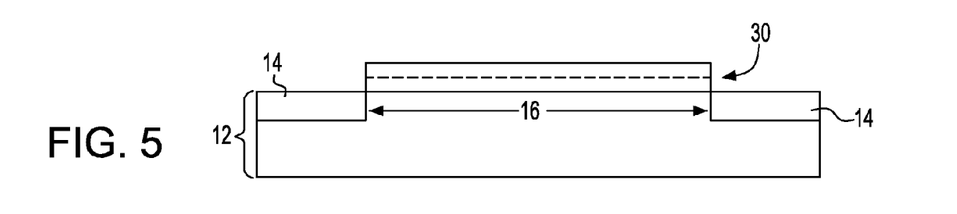
FIG. 5 is a pictorial representation (through a cross sectional view) illustrating a structure that is formed and used during one processing step of a fifth embodiment of the invention.

Reference is now made to FIG. 5 which illustrates a processing steps and a structure in a fifth embodiment of the invention. The fifth embodiment of the invention begins by providing the structure shown in FIG. 1B. Next, a graded SiGe layer 30 is formed on the active area 16 of the semiconductor substrate 12 in which the Ge content decreases upwardly as the layer is being formed. The graded SiGe layer 30 is formed utilizing a conventional epitaxial growth process as described above in the first embodiment except that during the course of SiGe growth the concentration of the Ge-containing precursor, e.g., GeH$_4$, is reduced providing an upper surface with a very low Ge content. The graded SiGe layer 30 has a Ge content from 30 atomic percent to 50 atomic percent during the initial stages of the growth process which is decreased to a value of less than 20 atomic percent an upper surface region thereof. The thickness of the SiGe layer 30 formed is typically from 30 angstroms to 200 angstroms, with a thickness from 50 angstroms to 100 angstroms being even more typical.

It is observed that the SiGe layer 30 of the fifth embodiment of the invention represents a SiGe film of the invention including a lower region having a higher Ge content than an upper region. In FIG. 5, the dotted line is used to illustrate these different Ge content regions.

It is observed that in first, second, fourth and fifth embodiments the engineered SiGe channel that is formed is comprised of a single layer, while in the third embodiment the SiGe channel is comprised of two SiGe layers. Notwithstanding the number of layers, the upper region of the inventive SiGe film prevents pitting and thinning during subsequent cleaning and processing. Moreover, the SiGe film remains smooth after the subsequent cleaning and processing due to the presence of the upper region that has the lower Ge content.

Figure 6:
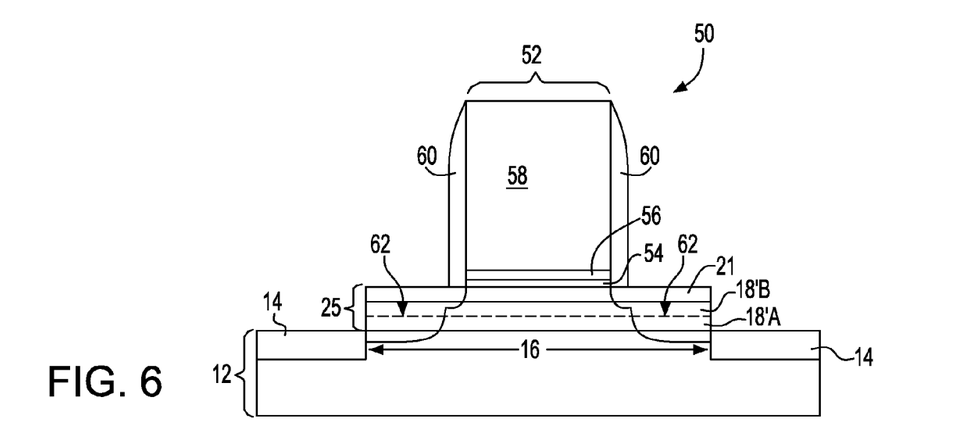
FIG. 6 is a pictorial representation (through a cross sectional view) depicting the formation of a pMOS device on the structure shown in FIG. 1E of the present invention.

Reference is now made to FIG. 6 which illustrates a structure 50 including the substrate shown in FIG. 1E and at least one MOS, particularly a pMOS 52, located on a surface of the Si film 18'; at least one nMOS (not shown) can be formed in an active area of the substrate to the periphery of the active area illustrated in this drawing. Although the pMOS is shown on the substrate provided in the first embodiment of the present invention, the pMOS can be formed on any of the substrates described and illustrated in the second-fifth embodiments of the invention. The pMOS 52 includes an optional interfacial layer 54, a high k gate dielectric 56 located either on a surface of the optional interfacial layer, if present, or atop the SiGe film 25 (e.g., the combination of Si cap 21 and the oxidized and stripped SiGe film 18') if the interfacial layer is not present, and a gate conductor 58 atop the high k gate dielectric 56. At least one optional spacer 60 made by present on the sidewalls of at least the gate conductor. The structure also includes source/drain diffusion regions 62 at the footprint of the patterned gate region.

The at least one pMOS 52 shown in FIG. 6 is fabricated utilizing conventional processing techniques well known to those skilled in the art. For example, the at least one pFET 52 can be formed by any sequence of deposition, lithography, and etching. One typical method to form the pMOS is to first form the optional interfacial layer utilizing a conventional growth technique (such as, for example, a wet chemical oxidation). Next, a stack containing the gate dielectric and gate electrode is formed by deposition, and thereafter lithography and etching is used to form a patterned gate region. The optional spacer 60 may then be formed by deposition and etching, followed by ion implantation and annealing, which steps are used to form the source and drain diffusion regions 62. Alternatively, a replacement gate process using a dummy gate can be used. So as not to obscure the invention, the details concerning the processing of the pMOS structure 52 are not provided herein.

The various elements of the pMOS 52 are now described in greater detail. With respect to the interfacial layer 54, the interfacial layer 54 is comprised of a semiconductor oxide, semiconductor nitride, semiconductor oxynitride or a nitrided semiconductor oxide. Preferably, the interfacial layer 54 is comprised of a silicon oxide or silicon nitride. The thickness of the interfacial layer 54 is typically from 0.5 nm to 1.5 nm, with a thickness from 0.8 nm to 1.0 nm being more typical. The thickness, however, may be different depending on the processing conditions used during the formation of the layer and subsequent formation of the other elements of the PFET device.

The high k gate dielectric 56 is comprised of an insulating material having a dielectric constant of greater than $SiO_2$. That is, the high k gate dielectric 56 employed in the invention is any insulating material having a dielectric constant of greater than 4.0, preferably greater than 7.0. The dielectric constants mentioned herein are relative to a vacuum, unless otherwise stated. Specifically, the high k gate dielectric 56 employed in the present invention includes, but is not limited to an oxide, nitride, oxynitride and/or silicates including metal silicates, aluminates, titanates and nitrides. In one embodiment, it is preferred that the gate dielectric 56 is comprised of an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof.

The physical thickness of the high k gate dielectric 56 may vary, but typically, the gate dielectric has a thickness from 0.5 nm to 10 nm, with a thickness from 0.5 nm to 2 nm being more typical.

The optional at least one spacer 60 is typically comprised of an insulating oxide, nitride, and/or oxynitride as well. The width of the optional at least one spacer 60, as measured at the bottom of the spacer, may vary, with typical ranges being from 20 nm to 80 nm. The gate conductor 58 is comprised of any conductive material including, for example, polysilicon, SiGe, an elemental metal, an alloy including an elemental metal, a metal silicide, a metal nitride or any combination thereof including multilayers. The thickness of the gate conductor 58 may vary, with typical thicknesses being from 20 nm to 200 nm.

It is observed that the above described elements represent basic elements that are present in most pMOS devices. Although description and illustration is shown for the above pMOS elements, the present invention also contemplates other MOS elements including raised source/drain regions, silicide regions, BEOL interconnect structures, etc. It is also observed that an nMOS may also be formed atop the SiGe film provided in the present invention, however a greater benefit is observed when the pMOS is formed thereon since the substrate is engineered to alter the bandgap of the substrate favorably for a pMOS.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a structure having an engineered SiGe channel comprising:
   providing a semiconductor substrate having at least one active area with an exposed upper semiconductor surface;
   forming a SiGe layer on the exposed upper semiconductor surface of the active area;
   subjecting said SiGe layer to heating in an oxidizing ambient, wherein said heating converts only the SiGe layer into an oxidized SiGe layer and forms a surface oxide layer on the oxidized SiGe layer, wherein said oxidized SiGe layer has a lower surface located directly on said exposed upper semiconductor surface of the active region of the semiconductor substrate;
   removing the surface oxide layer exposing an upper surface of the oxidized SiGe layer; and
   forming a Si cap on the exposed upper surface of the oxidized SiGe layer, wherein said Si cap and said oxidized SiGe layer form a SiGe film on the exposed upper surface of the active area, said SiGe film including a lower region that has a first Ge concentration and comprised of said oxidized SiGe layer, and an upper region that has a second Ge concentration and comprised of said Si cap, wherein the first Ge concentration is greater than the second Ge concentration.

2. The method of claim 1 wherein during said heating Ge atoms diffuse downward away from a lower surface of the surface oxide layer.

3. The method of claim 1 wherein said heating is an annealing step that is performed at a temperature from 800° C. to 1000° C.

4. The method of claim 1 wherein said oxidizing ambient includes at least one oxidizing gas selected from the group consisting of $O_2$, NO, $N_2O$, ozone and air.

5. The method of claim 1 further comprising a pMOS atop said SiGe film, said pMOS including a gate dielectric and an overlying gate conductor, said gate dielectric having a higher dielectric constant than $SiO_2$.

6. The method of claim 5 wherein said gate dielectric is one of $HfO_2$, $ZrO_2$, $Al_2O_3$, $TiO_2$, $La_2O_3$, $SrTiO_3$, $LaAlO_3$ and $Y_2O_3$.

7. The method of claim 5 wherein said gate conductor includes a p-type workfunction metal.

8. The method of claim 5 further comprising an interfacial layer positioned between said semiconductor substrate and said gate dielectric.

9. The method of claim 1 wherein said semiconductor substrate is a Si-containing semiconductor material.

10. The method of claim 1 wherein said semiconductor substrate comprises a contiguous semiconductor material which is located between a top surface and a bottom surface.

11. The method of claim 1 wherein said oxidized SiGe film has a lower region that has a Ge concentration that is greater than 25 atomic percent and an upper region that has a Ge concentration that is about 35 atomic percent or greater.

12. The method of claim 1 wherein said SiGe layer has a same crystal orientation as said semiconductor substrate.

13. A method of forming a structure having an engineered SiGe channel comprising:

provided a semiconductor substrate having at least one active area with an exposed upper semiconductor surface, wherein said semiconductor substrate comprises a contiguous semiconductor material located between a top surface and a bottom surface;

forming a SiGe layer on the exposed upper semiconductor surface of the active area;

subjecting said SiGe layer to heating in an oxidizing ambient, wherein said heating converts the SiGe layer into an oxidized SiGe layer and forms a surface oxide layer on the oxidized SiGe layer, wherein said oxidized SiGe layer has a lower surface located directly on said exposed upper semiconductor surface of the active region of the semiconductor substrate;

removing the surface oxide layer exposing an upper surface of the oxidized SiGe layer; and forming a Si cap on the exposed upper surface of the oxidized SiGe layer, wherein said Si cap and said oxidized SiGe layer form a SiGe film on the exposed upper surface of the active area, said SiGe film including a lower region that has a first Ge concentration and comprised of said oxidized SiGe layer, and an upper region that has a second Ge concentration and comprised of said Si cap, wherein the first Ge concentration is greater than the second Ge concentration.

* * * * *